United States Patent

Tani et al.

[11] Patent Number: 5,814,248
[45] Date of Patent: Sep. 29, 1998

[54] CONDUCTIVE PASTE COMPOSITION AND METHOD FOR PRODUCING A CERAMIC SUBSTRATE

[75] Inventors: Hiroji Tani, Nagaokakyo; Kazuhito Ohshita, Omihachiman, both of Japan

[73] Assignee: Murata Manufacturing Co., Ltd., Japan

[21] Appl. No.: 858,743

[22] Filed: May 19, 1997

[30] Foreign Application Priority Data

May 24, 1996 [JP] Japan ..................... 8-129668
Apr. 14, 1997 [JP] Japan ..................... 9-095812

[51] Int. Cl.$^6$ .................................. H01B 1/22
[52] U.S. Cl. .......................... 252/512; 106/1.13
[58] Field of Search ............... 252/512, 519.2; 106/1.13, 1.18

[56] References Cited

U.S. PATENT DOCUMENTS 4,599,277  7/1986  Brownlow et al. ............... 428/552
4,808,274  2/1989  Nguyen ........................ 204/15
5,378,408  1/1995  Carroll et al. ................ 252/514

FOREIGN PATENT DOCUMENTS 05174612  7/1993  Japan .
06057183  3/1994  Japan .

*Primary Examiner*—Mark Kopec
*Attorney, Agent, or Firm*—Ostrolenk, Faber, Gerb & Soffen, LLP

[57] ABSTRACT

A conductive paste composition comprises an organic vehicle, copper powder and an organometallic resinate which includes, as the metal, at least one metal selected from the group consisting of Pt, Ni and Bi. The amount of the metal component in the organometallic resinate is preferably in the range of about 0.1 to 5 wt. % with respect to the total amount of the copper power and the metal component. The copper powder has preferably an average diameter in the range of about 2 to 30 μm.

13 Claims, 1 Drawing Sheet

CONDUCTIVE PASTE COMPOSITION AND METHOD FOR PRODUCING A CERAMIC SUBSTRATE

BACKGROUND OF THE INVENTION

1. Field of the Invention

The present invention relates to a conductive paste, and more particularly to a conductive paste used for forming conductive vias within through holes of a ceramic substrate. The present invention also relates to a method for making a ceramic substrate in which through holes are filled with conductors vias.

2. Description of the Related Art

A ceramic substrate for mounting various kinds of electronic components often has through holes therein and conductive vias are formed in the through holes in order to electrically connect conductive patterns formed on opposing surfaces of the ceramic substrate. Conductive vias are also employed in some electronic components such as certain capacitors, inductors or composite electronic chips thereof.

Such ceramic substrate with conductive vias and conductive patterns has been prepared by the following method. Specifically, a plurality of ceramic green sheets provided with through holes by drilling or punching are first prepared. The through holes are filled with a conductive paste and a conductive paste is printed on the ceramic green sheets so as to form conductive patterns thereon. Thereafter, the ceramic sheets are stacked with each other by pressing, thereby forming a laminate. After the laminate is cut into pieces having a predetermined size, each piece of the laminate is sintered. During the sintering, the conductive paste in the though holes and the conductive paste printed on the ceramic green sheets are also sintered. Thus, prepared is a ceramic substrate which has conductive patterns electrically connected through the conductive vias.

A conventional conductive paste for forming the aforementioned conductive vias is generally composed of copper powder and an organic vehicle. Copper powder is employed because copper is an inexpensive material and is superior in electromigration and resistivity. However, the ceramic substrate prepared using the conventional conductive paste has the following problems. As shown in FIG. 1A, if the conductive paste shrinks more than the ceramic green sheet during the sintering, a void 13 or a crack 14 is formed in a conductive via 12 filled in a through hole 11 of the ceramic substrate 10. On the other hand, if the ceramic green sheet shrinks more than the conductive paste during the sintering, the conductive via 12 swells from the through hole 11 of the ceramic green sheet 10 or a crack 15 occurs along the periphery of the through hole 11, as shown in FIG. 1B. These defects cause disconnections between the conductive patterns in the ceramic substrate, thereby degrading the reliability of the ceramic substrate.

The inventors of the present invention have confirmed that a void 13 or a crack 14 is likely to occur due to insufficient filling of the conductive paste into the through hole or overshrinking of the conductive paste in the case where copper powder used in the conductive paste has an average diameter less than 2 $\mu$m. It was also confirmed by the inventors that the conductive via swells from the through hole in the case where copper powder used in the conductive paste has an average diameter more than 2 $\mu$m.

For the foregoing reasons, there is a need for a conductive paste which does not cause the aforementioned problems.

SUMMARY OF THE INVENTION

The present invention provide a conductive paste composition that satisfies this need. The conductive paste composition comprises an organic vehicle, copper powder and an organometallic resinate which includes, as the metal component, at least one metal selected from the group consisting of Pt, Ni and Bi.

According to another aspect of the present invention, a method for producing a multilayered ceramic substrate is provided. The method comprises the steps of: filling a conductive paste in through holes provided in a plurality of ceramic green sheets, the conductive paste being prepared by dispersing in an organic vehicle copper powder and an organometallic resinate which includes, as the metal component, at least one metal selected from the group consisting of Pt, Ni and Bi; laminating the ceramic green sheets to form a laminate; and sintering the laminate to form a multilayered ceramic substrate.

The amount of the metal component in the organometallic resinate is preferably in the range of about 0.1 to 5 wt. %, and more preferably about 0.5 to 3 wt. % with respect to the total amount of the copper power and the metal component. It is also preferable that the copper powder has an average diameter in the range of about 2 to 30 $\mu$m.

According to the preferred embodiment of the invention, the conductive paste prevents cracks or voids from forming in a conductive via in a through hole of a ceramic substrate. The conductive paste also prevent swelling of the conductive via and cracks of the ceramic substrate along the through hole. Therefore, a ceramic substrate prepared using the conductive paste is free from the aforementioned defects and has a high reliability in conductive vias.

These and other features, aspects, and advantages of the present invention will become better understood with reference to the following description and appended claims.

DETAILED DESCRIPTION OF THE INVENTION

The conductive paste according to one embodiment of the present invention is prepared by dispersing copper powder and an organometallic resinate in an organic vehicle. According the inventors' study, it is thought that the organometallic resinate decomposes to fine metal powder during heating and that the fine metal powder assists shrinking the conductive paste when the conductive paste is sintered.

Figure 1A:
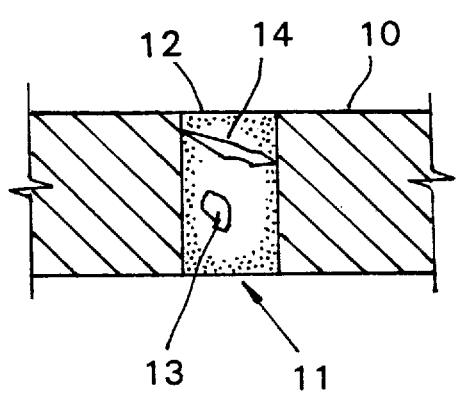
FIG. 1A shows a defective structure of a conductive via which is formed in a though hole of a ceramic substrate using a conventional conductive paste.
Figure 1B:
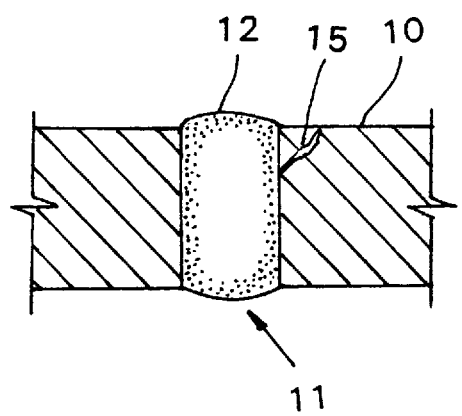
FIG. 1B shows another defective structure of a conductive via which is formed in a though hole of a ceramic substrate using a conventional conductive paste.

The copper powder used in this embodiment preferably has an average diameter in the range of about 2 to 30 $\mu$m, and the optimal average diameter is in the range of about 2 to 10 $\mu$m. If the average diameter is less than 2 $\mu$m, the conductive paste fills the through hole of a ceramic substrate insufficiently. This causes a void 13 or a crack 14 in the conductive via 12 as shown in FIG. 1A. The conductive via is also likely to contain residual carbon due to insufficient burning. On the other hand, if the average diameter of copper powder is greater than 30 μm, the copper powder is so coarse that the conductive paste including the copper powder is not suitable for screen printing.

The organometallic resinate used in this embodiment preferably includes Pt, Ni or Bi as the metal component. The amount of metal component in the organometallic resinate is preferably in the range of about 0.1 to 5 wt. %, and more preferably in the range of about 0.5 to 3 wt. %, with respect to the combined amount of copper powder and the metal component in the organometallic resinate. If the amount of the metal component of the organometallic resinate is less than 0.1 wt. %, the conductive paste has less effects to assist self-shrinkage. If the amount of the metal component of the organometallic resinate exceeds 5 wt. %, the conductive paste contains so much organic component therein that the organic component cannot be burned adequately during the sintering of the conductive paste.

The organic vehicle used in this embodiment is prepared by dissolving a resin component into a solvent component. For example, ethylcellulose may be dissolved in terpineol to form an organic vehicle. The combination of acrylic resin and terpineol or the combination of butyral resin and alcohol can also be employed. The organic vehicle used in this embodiment is not limited to the aforementioned examples, and may be selected from organic vehicles used in normal thick film pastes in view of the organic binder used in a ceramic green sheet to which the conductive paste is applied.

The mixing ratio of the copper powder and the organic vehicle may be one employed in normal conductive pastes. Specifically, about 75 to 95 wt. % of copper are preferably mixed with about 5 to 25 wt. % of the organic vehicle. It is more preferable that about 80 to 90 wt. % of copper are mixed with about 10 to 20 wt. % of the organic vehicle.

EXAMPLE

Copper powder and organometallic resinate containing Pt, Ni or Bi were dispersed in an organic vehicle consisting of ethylcellulose and terpineol and the mixture was thoroughly kneaded using a roller to form a conductive paste. Each of organometallic resinates contains the metal component at the ratio as shown in Table 1. The average diameter of the copper powder and the amount of the metal component of organometallic resinate with respect to the combined amount of copper powder and the metal component are shown in Table 2.

TABLE 1

| Metal contained in organometallic resinate | Amount of metal component (wt %) |
| --- | --- |
| Pt | 13.0 |
| Ni | 5.0 |
| Bi | 20.0 |

TABLE 2

| | Paste Composition | | | Results | | |
| --- | --- | --- | --- | --- | --- | --- |
| Sample | Average diameter of Cu (μm) | Organometallic resinate | Amount of Metal | Void | Swell | Crack in ceramic substrate |
| 1 | 5 | — | 0 | No | Yes | Yes |
| 2 | 5 | Pt | 0.1 | No | No | No |
| 3 | 5 | Pt | 1.0 | No | No | No |
| 4 | 5 | Pt | 3.0 | No | No | No |
| 5 | 5 | Pt | 5.0 | No | No | No |
| 6 | 5 | Ni | 1.0 | No | No | No |
| 7 | 5 | Bi | 1.0 | No | No | No |
| 8 | 1 | Pt | 1.0 | Yes | No | No |
| 9 | 2 | Pt | 1.0 | No | No | No |
| 10 | 10 | Pt | 1.0 | No | No | No |
| 11 | 30 | Pt | 1.0 | No | No | No |

As is understood from Table 2, Sample 1 does not includes organometallic resinate and is outside of the scope of the present invention.

Ceramic green sheets were also prepared. Specifically, a $BaO—Al_2O_3—SiO_2$—based glass composite material was prepared as a ceramic material and kneaded with an organic binder such as polyvinylbutyral and organic solvent such as toluene to form a ceramic slurry. Thereafter, a plurality of ceramic green sheets were formed by the doctor blade method using the ceramic slurry, and through holes are formed in the ceramic green sheets using drilling or punching.

Figure 2:
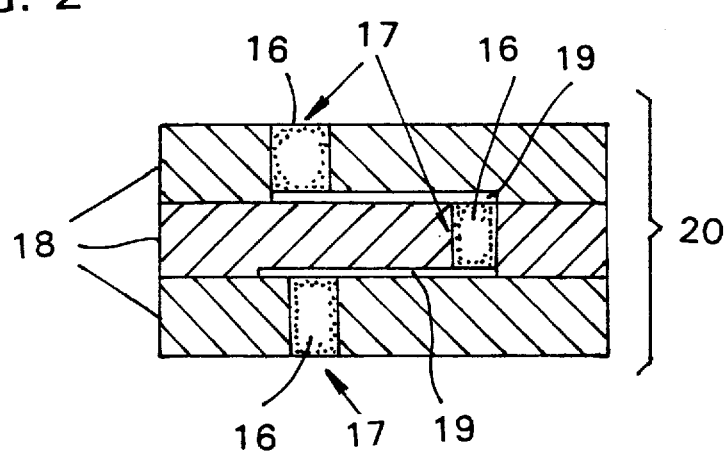
FIG. 2 shows a cross sectional structure at one step of producing a multilayered ceramic substrate.

As shown in FIG. 2, each conductive paste 16 of the aforementioned Samples 1–11 was filled in the through holes 17 of the ceramic green sheets 18, and a conductive paste was screen printed on the ceramic green sheets 18 to form conductive patterns 19. Then, the ceramic green sheets were laminated to form a laminate 20. The laminate 20 was cut into pieces, and each piece was sintered for one to two hours at 1000° C. under a $N_2$ atmosphere to obtain a multilayered ceramic substrate. During the sintering, ceramic green sheets 18, the conductive paste 16 filled in the though holes 17 and the conductive patterns 19 on the ceramic green sheets 18 are simultaneously sintered. Thus, prepared was a ceramic substrate which had conductive patterns electrically connected through the conductive vias.

The ceramic substrates prepared using the pastes of Samples 1–11 were then cut so as to expose the through holes and the exposed through holes are observed by microscopy. The results of the observation on each of Samples 1–11 are shown in Table 2.

Figure 3:
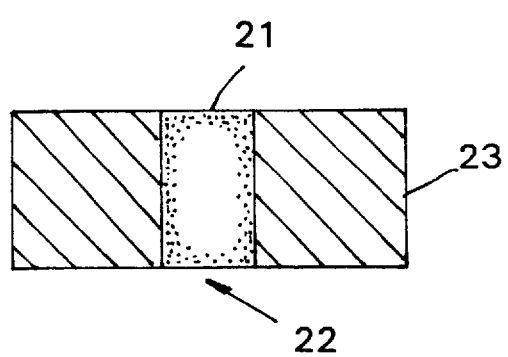
FIG. 3 shows a structure of a conductive via which is formed in a though hole of a ceramic substrate using a conductive paste according to one embodiment of the present invention.

As is understood form Table 2 and illustrated in FIG. 3, conductive vias 21 prepared using Samples 2–11 did not swell from the though holes 22. The ceramic substrate 23 has also no crack around the through holes 22. In addition, the conductive pastes of Samples 2–7 and 9–11 in which copper powder having an average diameter of 2 to 30 μm was employed show better results because no voids occurred in the conductive vias 21.

On the contrary, Sample 1 showed unfavorable results. That is, the conductive via prepared using Sample 1 swelled from the through holes and caused cracks in the ceramic substrate.

As is apparent from the aforementioned results, it is confirmed that there arise no cracks and voids in a conductive via as well as no cracks in a ceramic substrate around a through hole in the case where the metal component of the organometallic resinate is in the range of about 0.1 to 5 wt.

% with respect to the combined amount of copper powder and the metal component in the organometallic resinate.

Although each of Samples 2–11 contains only one kind of organometallic resinate in the aforementioned example, two or three metals selected from Pt, Ni and Bi may be contained in the conductive paste in the form of organometallic resinate.

The conductive paste according to the embodiment may contain another constituents, such a glass component, other than the copper powder, organic vehicle and the organometallic resinate. However, such a constituent may cause adverse effects if the amount of such other constituent is great. Therefore, the conductive paste preferably includes only copper powder, organic vehicle and organometallic resinate.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A conductive paste composition comprising an organic vehicle, copper powder and an organometallic resinate in which the metal component is at least one metal selected from the group consisting of Pt, Ni and Bi.

2. The conductive paste composition according to claim 1, wherein an amount of the metal in the organometallic resinate is in the range of about 0.1 to 5 wt. % with respect to the total amount of the copper power and the metal component.

3. The conductive paste composition according to claim 1, an amount of the metal component in the organometallic resinate is in the range of about 0.5 to 3 wt. % with respect to the total amount of the copper power and the metal component.

4. The conductive paste composition according to claim 1, wherein the copper powder has an average diameter in the range of about 2 to 30 $\mu$m.

5. The conductive paste composition according to claim 1, wherein the composition has about 75 to 95 parts by weight of the copper powder with respect to about 5 to 25 parts by weight of the organic vehicle.

6. The conductive paste composition according to claim 1, wherein the organic vehicle is composed of a combination selected from the group of ethylcellulose and terpineol, acrylic resin and terpineol, and butyral resin and alcohol.

7. A conductive paste composition consisting essentially of an organic vehicle, copper powder and an organometallic resinate in which the metal is at least one metal selected from the group consisting of Pt, Ni and Bi, wherein an amount of the metal component in the organometallic resinate is in the range of about 0.1 to 5 wt. % with respect to the total amount of the copper power and the metal and the composition includes about 75 to 95 parts by weight of the copper powder with respect to about 5 to 25 parts by weight of the organic vehicle.

8. The conductive paste composition according to claim 7, wherein the copper powder has an average diameter in the range of about 2 to 30 $\mu$m.

9. The conductive paste composition according to claim 8, the metal component in the organometallic resinate is Pt.

10. The conductive paste composition according to claim 8, the metal component in the organometallic resinate is Ni.

11. The conductive paste composition according to claim 8, the metal component in the organometallic resinate is Bi.

12. The conductive paste composition according to claim 8, an amount of the metal component in the organometallic resinate is in the range of about 0.5 to 3 wt. % with respect to the total amount of the copper power and the metal component.

13. The conductive paste according to claim 4, wherein the metal component is a single metal selected from said group.

* * * * *